(12) United States Patent
Mitamura et al.

(10) Patent No.: US 7,260,285 B2
(45) Date of Patent: Aug. 21, 2007

(54) OPTICAL MODULE WITH FLEXIBLE SUBSTRATE

(75) Inventors: Kazuhiro Mitamura, Kanagawa (JP); Isao Watanabe, Kanagawa (JP); Hidenori Itoh, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/497,237

(22) Filed: Aug. 2, 2006

(65) Prior Publication Data
US 2007/0031091 A1 Feb. 8, 2007

(30) Foreign Application Priority Data
Aug. 4, 2005 (JP) ............................. 2005-226683
Jul. 27, 2006 (JP) ............................. 2006-204089

(51) Int. Cl.
*G02B 6/12* (2006.01)
*H04B 10/00* (2006.01)

(52) U.S. Cl. ............................. 385/14; 385/15; 385/49; 385/88; 385/92; 398/135

(58) Field of Classification Search .................. 385/14, 385/49, 88, 89, 92, 93, 94, 129, 130, 131, 385/132, 15; 398/135, 138, 139
See application file for complete search history.

(56) References Cited

U.S. PATENT DOCUMENTS 5,249,245 A * 9/1993 Lebby et al. ................. 385/89
5,625,734 A * 4/1997 Thomas et al. ............... 385/88
5,768,456 A * 6/1998 Knapp et al. ................. 385/49
2004/0264882 A1* 12/2004 Torigoe et al. ............... 385/88
2005/0168957 A1* 8/2005 Kawauchi et al. .......... 361/749
2007/0031091 A1* 2/2007 Mitamura et al. ............ 385/88

FOREIGN PATENT DOCUMENTS

JP          9-214086       8/1997       ............... 385/92 X
JP          2001-298217    10/2001      ............... 385/92 X

* cited by examiner

Primary Examiner—Brian M. Healy
(74) Attorney, Agent, or Firm—Young & Thompson

(57) ABSTRACT

An optical module with flexible substrate that improves high-frequency characteristics. A flexible substrate 30 is formed with a top wiring layer 32 and a bottom wiring layer 34 formed on both surfaces of a polyimide layer 33, where the top wiring layer 32 has a plurality of wiring patterns 32a that electrically connect the leads 11 of the optical module 10 to the drive circuit of a circuit board 50, and the bottom wiring layer 34 is located on the entire surface of one side of the polyimide layer 33 so that it is electrically insulated from the wiring patterns 32a, is electrically connected to the ground of the circuit board 50, and is electrically connected to at least the leads 11 and, depending on its relationship with the wiring patterns 32a, to the stem 12 of the optical module 10 at a specified position of a stub region 34a having stub structure.

5 Claims, 6 Drawing Sheets

OPTICAL MODULE WITH FLEXIBLE SUBSTRATE

FIELD OF THE INVENTION

This invention relates to an optical module with flexible substrate in which the optical module is electrically connected to a circuit board by way of a flexible substrate, and more particularly relates to an optical module with flexible substrate that is capable of improving high-frequency characteristics.

BACKGROUND OF THE INVENTION

In recent years, in optical transceivers 101 such as an XFP (10 Gbit Small Form Factor Pluggable) optical transceiver, an optical module 110 (light-receiving element, light-emitting element) is mounted inside a housing 120, and in order to maintain 10 Gbps-class high-frequency transmission characteristics, the optical module 110 is electrically connected to a circuit board 150 (board having a drive circuit) by way of a flexible substrate 130 (see FIG. 3, patent document 1). One reason for this kind of construction is that, as shown in FIG. 4, when the leads 111 of the optical module 110 are bent and electrically connected (using solder) to the circuit board 150 directly without using a flexible substrate 130, an impedance component is seen in the lead 111 section, and high-frequency characteristics become poor (see FIG. 4).

[Patent Document 1]
Japanese Patent Kokai Publication No. JP-P2001-298217 A

[Patent Document 2]
Japanese Patent Kokai Publication No. JP-A-9-214086

SUMMARY OF THE DISCLOSURE

However, in an optical transceiver 101 of this first example of prior art (see FIG. 3), when the optical module 110 is electrically connected to the circuit board 150 by way of a flexible substrate 130, problems as described below occur.

Referring to FIG. 5, a large portion of high-frequency current I flows from the main optical module 110 through the leads 111 and wiring pattern 132a of the flexible substrate 130 to the circuit board 150. Also, a small amount of high-frequency current I' flows from the main optical module 110, through the leads 111 and to the wiring layer 134 on the bottom surface of the flexible substrate 130. The reason for this is that even though direct-current insulation is performed (the leads 111 and wiring surface 134 on the bottom surface are insulated), a small amount of displacement current explained by Maxwell's equations flows from the leads 111 to the wiring layer 134 on the bottom surface of the flexible substrate 130.

Also, in FIG. 5, the flexible substrate 130 is only soldered at the lead 111 section. In this case, of the wiring layer 134 on the bottom surface of the flexible substrate 130, there is a potential for stub structure (structure having a transmission path that branches the current) to exist in the stub region 134a that is encircled by an elongated circle. In the stub region 134a, resonance (phenomenon in which the current flowing to the stub region 134a resonates and increases) occurs at a certain frequency that corresponds to the length, radiation occurs due to the non-intentional formation of a common-mode current path, and GND fluctuation (shift from 0 [V]) occurs, so there is a possibility that the high-frequency characteristics (S parameter, mask margin at the eye opening, etc.) will become poor.

When the stub region 134a on the bottom wiring layer 134 is eliminated, the stub structure disappears, however, when high-frequency current I flows to the wiring pattern 132a, a non-intentional line-shaped antenna or loop antenna is formed, and it becomes extremely easy for electromagnetic wave radiation to occur, which has an adverse effect on the external circuits.

It is a main object of the present invention to improve the high-frequency characteristics.

A first aspect of the present invention provides an optical module with flexible substrate comprising: an optical module in which optical elements are mounted and a plurality of leads run to the outside of a stem; and a flexible substrate that is electrically connected the optical module. The flexible substrate is formed with a first wiring layer and second wiring layer on both sides of a resin layer; the first wiring layer has a plurality of wiring patterns that are electrically connected the leads; and the second wiring layer is located on the entire surface of one side of the resin layer so that it is electrically insulated from the wiring patterns, and is electrically connected to the stem at a specific position so as to define at least a part of the second wiring layer as a stub region having a stub structure for the lead.

It is preferred that the optical module with flexible substrate further comprises: a circuit board that drives the optical module, wherein the flexible substrate electrically connects the optical module and the circuit board, the wiring patterns electrically connect the leads with the driving circuit of the circuit board, and the second wiring layer is electrically connected with the GND of the circuit board.

In the optical module with flexible substrate of the present invention, it is preferred that the first wiring layer have a dummy wiring pattern that is electrically insulated from the wiring patterns, and be located at a position that corresponds to the stub region of the second wiring layer; and that the dummy wiring pattern be electrically connected to the second wiring layer and the stem at a specified position of the stub region.

In the optical module with flexible substrate of the present invention, it is preferred that the dummy wiring pattern be connected to the second wiring layer at a specified position of the stub region by a via connection.

In the optical module with flexible substrate of the present invention, it is preferred that the second wiring layer be electrically connected to the stem by part or all of a region that overlaps the stem.

In the optical module with flexible substrate of the present invention, it is preferred that second wiring layer be electrically connected to the stem by solder or a conductive resin.

With the present invention, it is possible to greatly increase the resonant frequency of the stub region of the bottom wiring layer of the flexible substrate, and thus it is possible to eliminate the problem of deteriorating high-frequency characteristics.

BRIEF DESCRIPTION OF THE DRAWINGS

FIG. 1A is a side view of the inside of the housing, FIG. 1B is a view as seen from the direction of the arrow L, and FIG. 1C is a partial cross-sectional view of the section X-X'.

FIG. 2A is a side view of the inside of the housing, FIG. 2B is a view as seen from the direction of the arrow M, and FIG. 1C is a partial cross-sectional view of the section Y-Y'.

FIG. 3A is an external pictorial view, and FIG. 3B is a side view of inside the housing.

FIG. 5A is a side view of the inside of the housing, FIG. 5B is a view as seen from the direction of the arrow N, and FIG. 5C is a partial cross-sectional view of the section Z-Z'.

FIG. 6A is a side view of the inside of the housing, FIG. 6B is a view as seen from the direction of the arrow P, and FIG. 6C is a partial cross-sectional view of the section Q-Q'.

PREFERRED EMBODIMENTS OF THE INVENTION

Embodiment 1

Figure 1A:
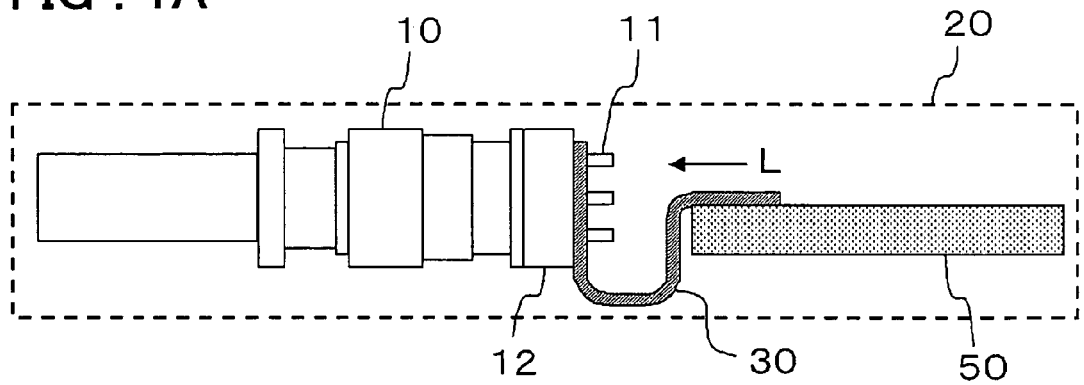
FIGS. 1A, 1B and 1C are drawings showing the construction of the optical transceiver of a first embodiment of the present invention, where
Figure 1B:
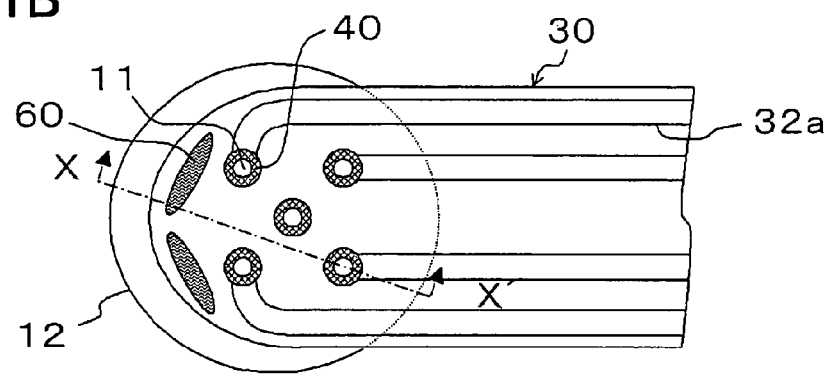
Figure 1C:
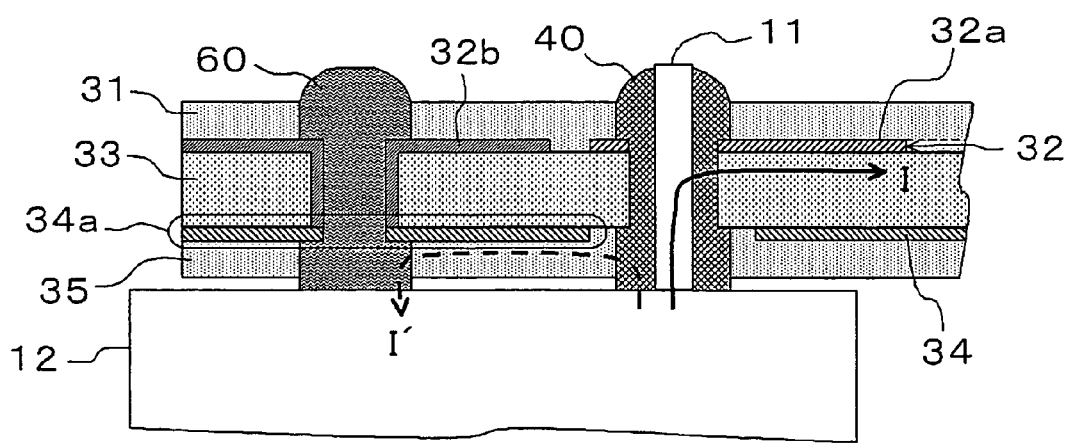

The optical transceiver of a first embodiment of the present invention will be explained using the drawings. FIGS. 1A, 1B and 1C are drawings showing the construction of the optical transceiver of a first embodiment of the present invention, where FIG. 1A is a side view of the inside of the housing, FIG. 1B is a view as seen from the direction of the arrow L, and FIG. 1C is a partial cross-sectional view of the section X-X'.

The optical transceiver is an optical transceiver with a flexible substrate in which an optical module 10 is electrically connected to a circuit board 50 by way of a flexible substrate 30, and it comprises: an optical module 10, housing 20, flexible substrate 30 and circuit board 50.

The optical module 10 is a device that converts an electrical signal to an optical signal, and with single-mode fiber (SMF) or multi-mode fiber (MMF) as a transmission path, transmits or receives data between communication devices, network devices, computers, memory devices or the like. A device that handles digital signals having a transmission rate of 1 to 20 Gbps, and a frequency component having a frequency of 0 to 17.5 GHz can be used as the optical module 10. The optical module 10 is mounted inside a housing 20, and when used on the receiving side, has a light-receiving element, and when used on the transmitting side, has a light-emitting element. The optical module 10 is divided into sub modules in which the light-receiving element or light-emitting element (optical element) is mounted using a cylindrical-shaped housing and a stem 12. The optical module 10 has a plurality of leads 11 that together with being electrically connected to the light-receiving element or light-emitting element, run to the outside of the stem 12. The leads 11 are electrically connected to the corresponding wiring patterns 32a by way of solder 40. The stem 12 is electrically insulated from the lead 11, and a dummy wiring pattern 32b and stub region 34a of the flexible substrate 30 are electrically connected by solder 60 in a through hole that is formed in the stub region 34a of the wiring layer 34 on the bottom surface.

Figure 3A:
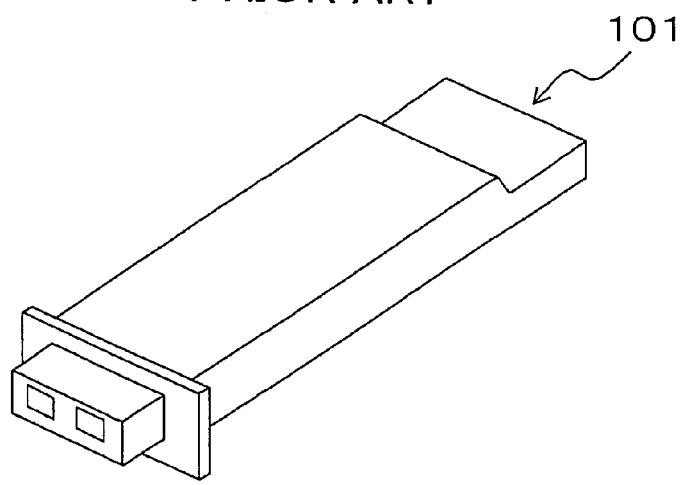
FIGS. 3A and 3B are drawings showing the construction of the optical transceiver of a first example of prior art, where
Figure 3B:
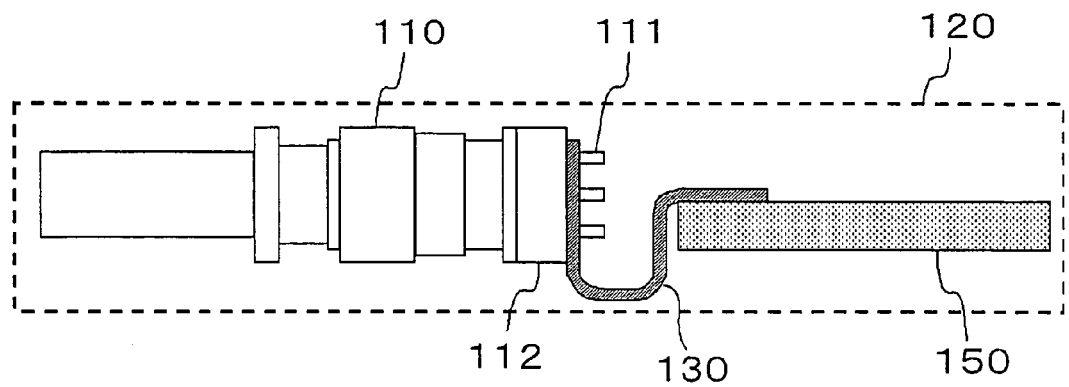
Figure 4:
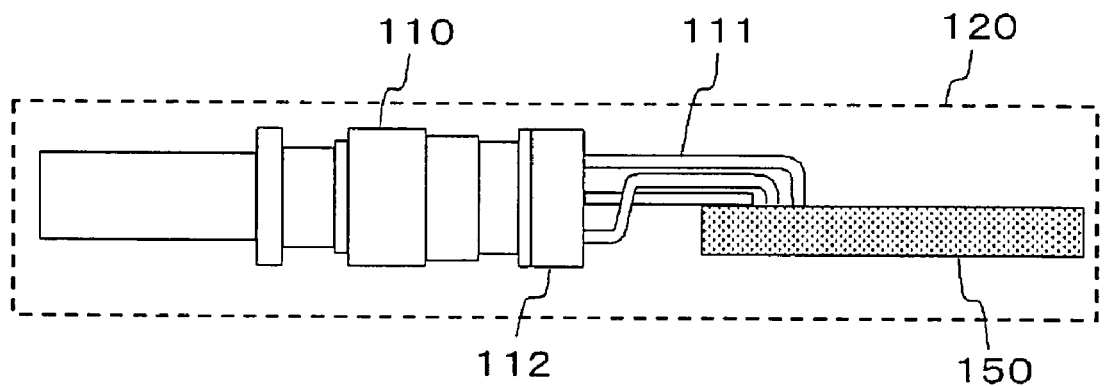
FIG. 4 is a drawing showing the construction of the optical transceiver of a second example of prior art
Figure 5A:
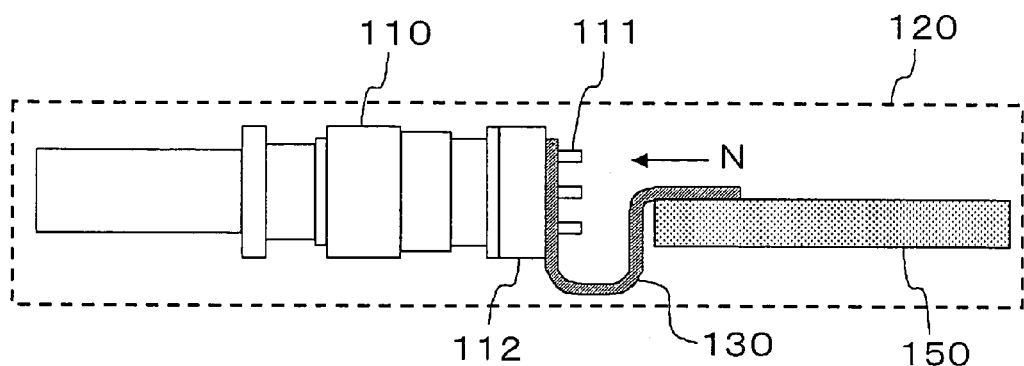
FIGS. 5A, 5B and 5C are drawings showing the construction of the optical transceiver of a first example of prior art, where
Figure 5B:
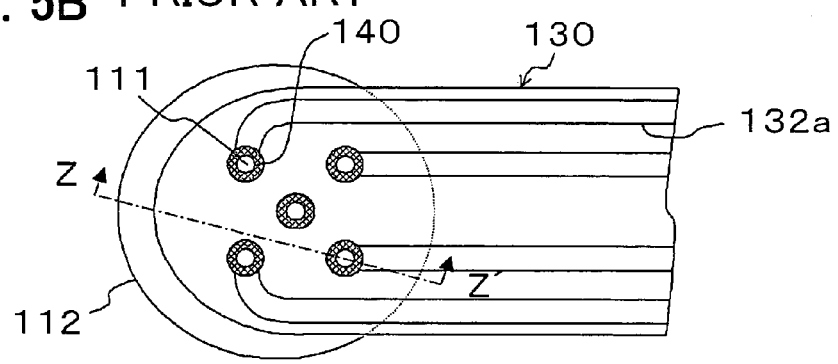
Figure 5C:
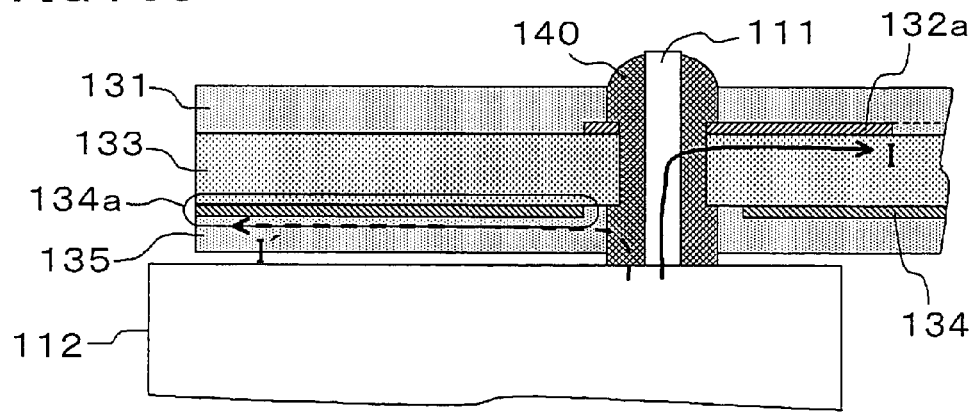

The housing 20 houses the optical module 10, flexible substrate 30 and circuit board 50. The housing 20 has an opening section that opens up to the optical module 10. The housing 20 can be constructed so that it has external construction similar to that shown in FIG. 3A.

The flexible substrate 30 is constructed by forming a top wiring layer 32 and a bottom wiring layer 34 made of a metal (copper.) foil having a specified thickness on both sides of a polyimide layer 33 having a specified thickness, and covering the surface on the side of the top wiring layer 32 with a cover layer 31, and covering the surface on the side of the bottom wiring layer 34 with a cover layer 35. The flexible substrate 30 is placed in a curved state inside the housing 20. The flexible substrate 30 has through holes formed at positions that correspond with the leads 11 of the optical module 10, and the leads 11 of the optical module 10 that are inserted through these through holes are electrically connected to the wiring pattern 32a of the top wiring layer 32, and the leads 11 of the optical module 10, the dummy wiring pattern 32b and bottom wiring layer 34 are electrically insulated. The flexible substrate 30 has a through hole formed at a specified position in the stub region 34a of the bottom wiring layer 34, where the stem 12, dummy wiring pattern 32b and bottom wiring layer 34 are electrically connected using that through hole, and the stem 12 and wiring pattern 32a are electrically insulated. The thickness of the flexible substrate 30 is about 50 µm, for example. The relative permittivity (dielectric constant) of the flexible substrate 30 is about 3.4, for example. The wiring width of the wiring of the wiring pattern 32a is about 100 µm, for example.

A plurality of wiring patterns 32a that correspond to each of the leads 11 of the optical module 10, and a dummy wiring pattern 32b that corresponds to the stub region 34a are formed on the top wiring layer 32. The wiring patterns 32a are electrically connected to the corresponding leads 11, respectively, using solder 40, and are electrically connected to the electrodes (not shown in the figure) of the drive circuit of the circuit board 50. The dummy wiring pattern 32b is electrically insulated from the wiring patterns 32a, and is connected to the stub region 34a using a via connection in the through hole that is formed in the stub region 34a, and electrically connected to the stem 12 using solder 60.

The bottom wiring layer 34 is located on the entire surface of one side of the polyimide layer 33 so that it is electrically insulated from the solder 40 (wiring pattern 32a) in the through hole of the flexible substrate 30, is electrically connected to the dummy wiring pattern 32b at a specified position of the stub region 34a, is electrically connected to the stem 12 by way of solder 60 at a specified position of the stub region 34a, and is electrically connected to GND (not shown in the figure) of the circuit board 50. The stub region 34a is a region where the wiring pattern 32a of the bottom wiring layer 34 is not located when viewed from the planar direction.

The circuit board 50 is a board having a circuit that drives the optical module 10, and is mounted inside the housing 20. Electronic parts (for example, a pre-amp IC, signal-processing IC, chip resistor, chip capacitor, etc.; not shown in the figure) for performing signal processing for the optical module 10 are mounted on the circuit board 50. The circuit board 50 is electrically connected to the bottom wiring layer 34 by GND (not shown in the figure), and is electrically connected to the corresponding wiring patterns 32a by specified electrodes (not shown in the figure).

With this first embodiment, the stub region 34a of the bottom wiring layer 34 is electrically connected to the dummy wiring pattern 32b of the top wiring layer 32 and the stem 12 by the solder 60, so the length of the wiring of the stub region 34a becomes short, and thus it is possible to increase the resonant frequency. Particularly, this is effective when the length of the stub region 34a is a length from the position where the wiring pattern 32a and leads 11 are electrically connected that corresponds to ¼ of the wavelength having a frequency of a 10 GHz or greater (for example, 4.6 mm when the frequency is 10 GHz, 3.1 mm when the frequency is 15 GHz, or 2.6 mm when the frequency is 20 GHz).

Also, the stem 12 is connected to GND by electrically connecting the bottom wiring layer 34 to the stem 12 (with solder 60), so it is possible to suppress GND fluctuation (shift from 0 [V]) of the bottom wiring layer 34 even when there is leakage of high-frequency current I'. In other words, by soldering the bottom wiring layer 34, the GND of the high-frequency of the bottom wiring layer 34 is strengthened.

Moreover, by electrically connecting the stub region 34a of the bottom wiring layer 34 to the stem 12 (with solder 60), it is possible to greatly increase the resonant frequency.

Furthermore, by connecting the stem 12 to the GND (not shown in the figure) of the circuit board 50 by way of the solder 60 and bottom wiring layer 34, the GND of the stem 12 is strengthened, and it is possible to suppress GND fluctuation even when high-frequency current I' flows in the bottom wiring layer 34 of the flexible substrate 30.

Embodiment 2

Figure 2A:
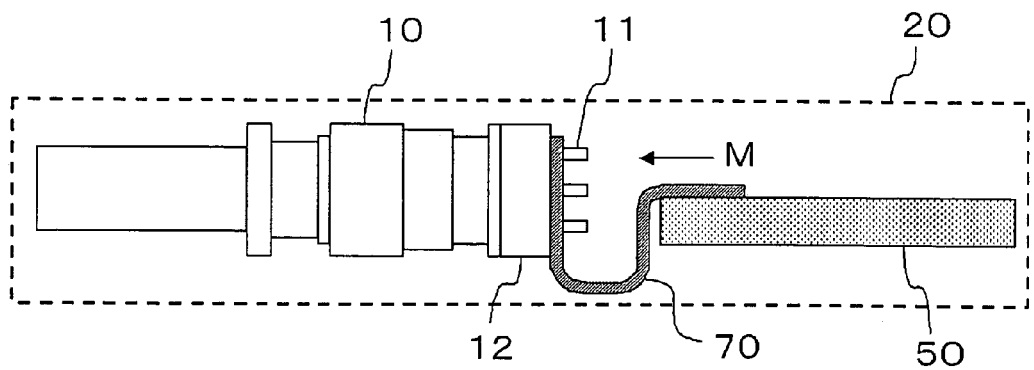
FIGS. 2A, 2B and 2C are drawings showing the construction of the optical transceiver of a second embodiment of the present invention, where
Figure 2B:
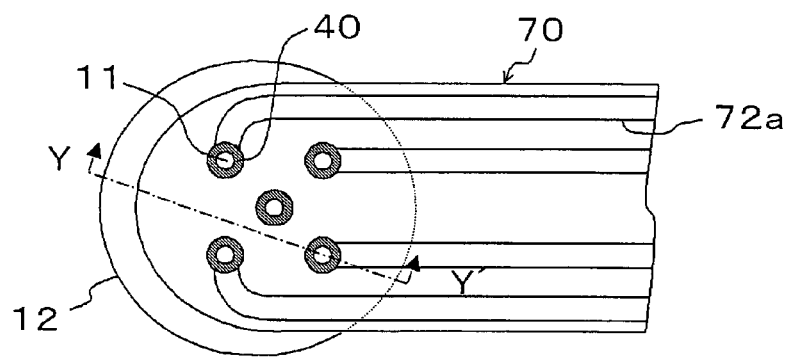
Figure 2C:
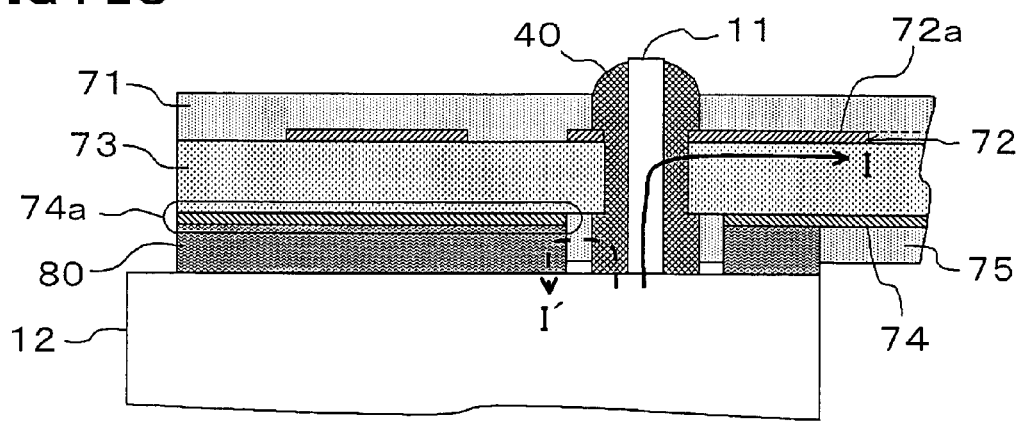

The optical transceiver of a second embodiment of the present invention will be explained using the drawings. FIGS. 2A, 2B and 2C are drawings showing the construction of the optical transceiver of a second embodiment of the present invention, where FIG. 2A is a side view of the inside of the housing, FIG. 2B is a view as seen from the direction of the arrow M, and FIG. 1C is a partial cross-sectional view of the section Y-Y'.

The construction of the flexible substrate 70 of the optical transceiver of this second embodiment differs from that of the first embodiment.

The flexible substrate 70 is constructed by forming a top wiring layer 72 and a bottom wiring layer 74 made of copper foil having a specified thickness on both sides of a polyimide layer 73 having a specified thickness, and covering the surface on the side of the top wiring layer 72 with a cover layer 71, and covering the surface on the side of the bottom wiring layer 74 with a cover layer 75. The flexible substrate 70 is placed in a curved state inside the housing 20. The flexible substrate 70 has through holes formed at positions that correspond with the leads 11 of the optical module 10, and the leads 11 of the optical module 10 that are inserted through these through holes are electrically connected to the wiring pattern 72a of the top wiring layer 72. The flexible substrate 70 does not have a through hole formed at a specified position in the stub region 74a of the bottom wiring layer 74 as is FIG. 1. The thickness of the flexible substrate 70 is about 50 μm, for example. The relative permittivity of the flexible substrate 70 is about 3.4, for example. The wiring width of the wiring of the wiring pattern 72a is about 100 μm, for example.

A plurality of wiring patterns 72a that correspond to the leads 11 of the optical module 10 are formed on the top wiring layer 72. There is no dummy wiring pattern that corresponds to the stub region 74a on the top wiring layer 72 as contrasted to the first embodiment. Each of the wiring patterns 72a are electrically connected to the corresponding leads 11 by way of solder 40, and electrically connected to electrodes (not shown in the figure) of the circuit board 50.

The bottom (reverse side) wiring layer 74 is located over the enter surface of the substrate and is such that it is not electrically connected to the solder 40 that is located in the through holes in the flexible substrate 70. None or only part of the region of the bottom wiring layer 74 that overlaps the stem 12 is covered by the cover layer 75, and the bottom wiring layer 74 is electrically connected to the stem 12 by way of solder 80 (or by conductive adhesive). The bottom wiring layer 74 is electrically connected to GND (not shown in the figure) of the circuit board 50. The stub region 74a is a region where the wiring pattern 72a of the bottom wiring layer 74 is not located when viewed from the direction normal to the plane.

With this second embodiment, a small amount of high-frequency current I' that flows in the bottom wiring layer 74 flows to the stem 12 through the solder 80, so the resonant frequency of the stub region 74a greatly increases.

Also, since the area of contact between the bottom wiring layer 74 and the stem 12 is large, the stability of the GND of the flexible substrate 70 is further increased, and likewise as in the first embodiment, the length of the wiring of the stub region 74a becomes short, and thus it is possible to greatly increase the resonant frequency.

Furthermore, adhesion between the flexible substrate 70, optical module 10 and stem 12 is further improved, so strength against a force that occurs during assembly or during vibration or impact that would separate the flexible substrate 70 from the stem 12 is increased.

Embodiment 3

Figure 6A:
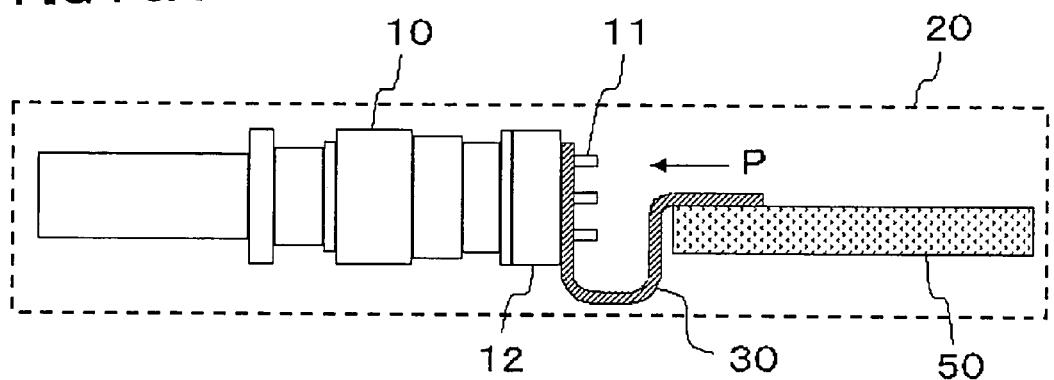
FIGS. 6A, 6B and 6C are drawings showing the construction of the optical transceiver of a first embodiment of the present invention, where
Figure 6B:
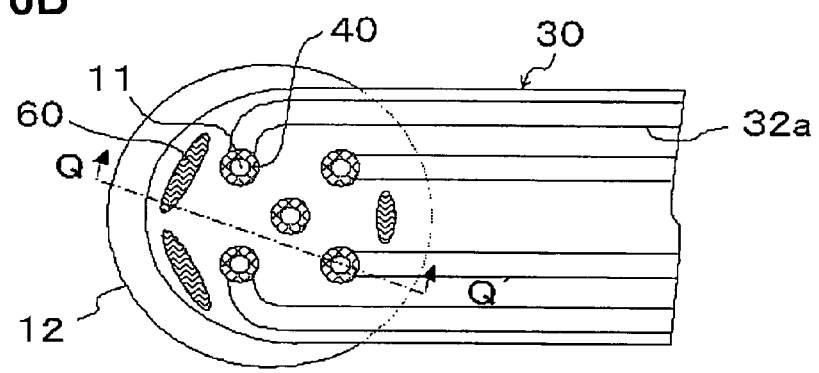
Figure 6C:
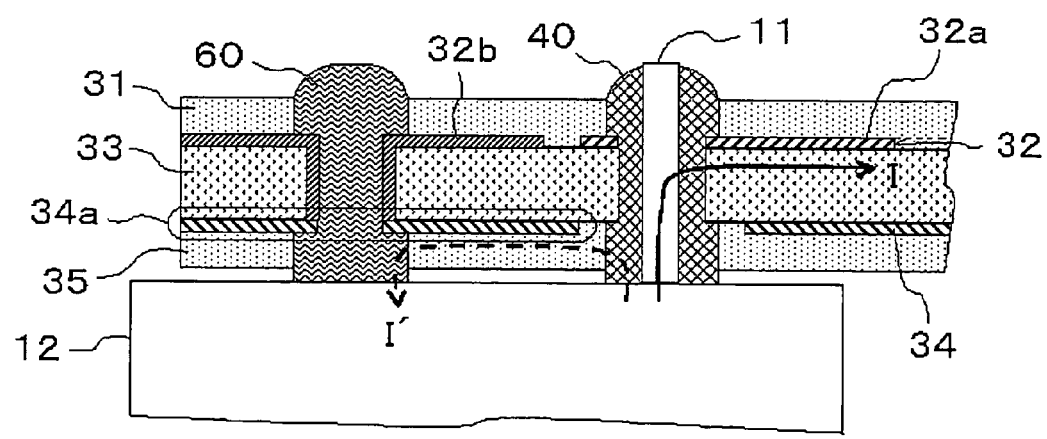

An optical transceiver of a third embodiment of the present invention will be explained the drawings. FIGS. 6A, 6B and 6C are drawings showing the construction of the optical transceiver of the third embodiment of the present invention, wherein FIG. 6A is a side view of the inside of the housing, FIG. 6B is a view as seen from the direction of the arrow P, and FIG. 6C is a partial cross-sectional view of the section Q-Q'.

The optical transceiver of the third embodiment differs from that of the first embodiment in that the connecting points the solder 60 in the optical transceiver of the first embodiment are changed from two to three (or more). The other structure remains unchanged.

According to the third embodiment, the connecting points between the stem 12 and the bottom wiring layer 34 are increased, resulting in a further strengthening of the ground and an improved high frequency characteristics. The connecting area between the dummy wiring pattern 32b of the flexible substrate 130 and the solder 60 is increased, so as to increase the adhesion strength of the solder 60 to the flexible substrate.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An optical module with a flexible substrate, comprising:

an optical module in which optical elements are mounted and which includes a stem and a plurality of leads that run to an outside of said stem; and a flexible substrate that is electrically connected to said optical module, said flexible substrate having an opening and said stem having an electrically conductive protrusion outside of said stem, separate from said plurality of leads and electrically connected to said stem, that extends through said opening;

said flexible substrate having a first wiring layer and a second wiring layer on respective opposite sides of a resin layer;

said first wiring layer being on one of said sides of said resin layer and having a plurality of wiring patterns that are electrically connected to said plurality of leads and a dummy wiring pattern that is electrically isolated from said plurality of leads and electrically connected to said protrusion; and said second wiring layer being on the opposite one of said sides of said resin layer and electrically insulated from said wiring patterns and electrically connected to said protrusion and to said dummy wiring pattern.

2. The optical module with flexible substrate of claim 1, further comprising:

a circuit board that drives said optical module, wherein said flexible substrate electrically connects said optical module and said circuit board, said wiring patterns electrically connect said leads with a driving circuit of said circuit board, and said second wiring layer is electrically connected with a ground of said circuit board.

3. The optical module with flexible substrate of claim 1, wherein said protrusion is made of solder.

4. The optical module with flexible substrate of claim 1, further comprising a circuit board that drives said optical module, wherein said first wiring layer is electrically connected to a drive circuit of said circuit board and said second wiring layer is electrically connected to the ground of said circuit board.

5. The optical module with flexible substrate of claim 4, wherein said optical module with flexible substrate is an optical transceiver.

* * * * *